US008558320B2

(12) United States Patent
Yang et al.

(10) Patent No.: US 8,558,320 B2
(45) Date of Patent: Oct. 15, 2013

(54) SYSTEMS AND METHODS EMPLOYING A PHYSICALLY ASYMMETRIC SEMICONDUCTOR DEVICE HAVING SYMMETRICAL ELECTRICAL BEHAVIOR

(75) Inventors: Haining Yang, San Diego, CA (US); Chock H. Gan, San Diego, CA (US); Zhongze Wang, San Diego, CA (US); Beom-Mo Han, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 241 days.

(21) Appl. No.: 12/638,557

(22) Filed: Dec. 15, 2009

(65) Prior Publication Data

US 2011/0140288 A1    Jun. 16, 2011

(51) Int. Cl.
*H01L 27/092* (2006.01)
(52) U.S. Cl.
USPC .......................................................... 257/377
(58) Field of Classification Search
USPC ........... 257/377–384, 202–206, E27.006, 397
See application file for complete search history.

(56) References Cited

U.S. PATENT DOCUMENTS

| | | | | |
|---|---|---|---|---|
| 5,172,202 A | * | 12/1992 | Kazuo | 257/306 |
| 5,396,100 A | * | 3/1995 | Yamasaki et al. | 257/390 |
| 5,877,522 A | * | 3/1999 | Kasai | 257/306 |
| 6,121,645 A | * | 9/2000 | Masuda et al. | 257/207 |
| 6,146,978 A | * | 11/2000 | Michael et al. | 438/453 |
| 6,621,110 B1 | | 9/2003 | Matsuoka et al. | |
| 6,834,008 B2 | * | 12/2004 | Rinerson et al. | 365/158 |
| 6,864,518 B1 | | 3/2005 | Longway et al. | |
| 6,903,414 B2 | * | 6/2005 | Son | 257/330 |
| 7,271,408 B2 | * | 9/2007 | Kim et al. | 257/48 |
| 7,638,878 B2 | * | 12/2009 | Aritome | 257/758 |
| 7,868,461 B2 | * | 1/2011 | Yang et al. | 257/776 |
| 8,058,671 B2 | * | 11/2011 | Becker et al. | 257/206 |
| 8,058,734 B2 | * | 11/2011 | Ono | 257/775 |
| 2001/0010958 A1 | | 8/2001 | Liaw et al. | |
| 2002/0195680 A1 | * | 12/2002 | Son | 257/510 |
| 2004/0238863 A1 | | 12/2004 | Liu et al. | |
| 2005/0001271 A1 | * | 1/2005 | Kobayashi | 257/368 |
| 2007/0032063 A1 | * | 2/2007 | Sutardja | 438/599 |
| 2007/0241378 A1 | * | 10/2007 | Aritome | 257/295 |
| 2007/0290192 A1 | * | 12/2007 | Rotondaro | 257/19 |
| 2008/0008013 A1 | | 1/2008 | Ohgami et al. | |
| 2008/0123388 A1 | | 5/2008 | Scott et al. | |
| 2009/0079012 A1 | | 3/2009 | Park et al. | |
| 2010/0136787 A1 | * | 6/2010 | Aritome | 438/670 |
| 2011/0317485 A1 | * | 12/2011 | Liaw | 365/182 |

OTHER PUBLICATIONS

International Search Report and Written Opinion—PCT/US2010/060546, International Search Authority—European Patent Office—Apr. 1, 2011.
Taiwan Search Report—TW099144043—TIPO—May 16, 2013.

* cited by examiner

*Primary Examiner* — Nathan Ha
(74) *Attorney, Agent, or Firm* — Sam Talpalatsky; Nicholas J. Pauley; Joseph Agusta (57) ABSTRACT

An integrated circuit device comprising a first elongate structure and a second elongate structure arranged parallel to each other and defining a space therebetween. The integrated circuit device also includes conductive structures distributed in the space between the first and second elongate structures. At least a first one of the conductive structures is placed closer to the first elongate structure than to the second elongate structure. At least a second one of the conductive structures is placed closer to the second elongate structure than to the first elongate structure.

23 Claims, 9 Drawing Sheets

FIG. 10

SYSTEMS AND METHODS EMPLOYING A PHYSICALLY ASYMMETRIC SEMICONDUCTOR DEVICE HAVING SYMMETRICAL ELECTRICAL BEHAVIOR

TECHNICAL FIELD

The present description generally relates to integrated circuit designs. More specifically, the present description relates to circuit designs that employ locally asymmetric placement of structures within integrated circuits.

BACKGROUND

Conventional tools for designing integrated circuits use specific grids when laying out the components in a design. For example, some older grids use 100 nm unit spacing, while newer grids use 5 nm and 1 nm spacings. Grids include rigid rules regarding where structures can be placed. For example, when using a 5 nm grid, lines and points can only be placed every 5 nm. Thus, using a finer grid can offer a designer flexibility in placement of structures. However, the tradeoff of flexibility is data volume, which increases significantly as a grid becomes finer. Furthermore, in some scenarios, it is undesirable to use differently sized grids (e.g., a 5 nm grid and a 1 nm grid) for components that are placed together in the same device (e.g., a word line driver and a memory array placed together in a memory circuit) because unexpected sizing issues may occur at the boundary of the two components.

Figure 1:
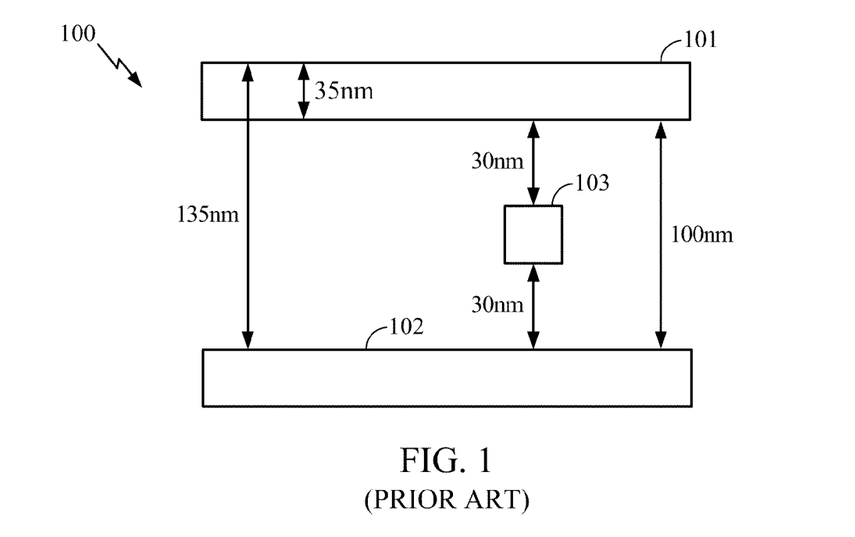
FIG. 1 shows a conventional circuit design.

FIG. 1 shows an example design 100 using a conventional approach and a 5 nm grid. The design 100 has a gate 101 with a 35 nm gate length, a gate 102, and a contact 103. The gate pitch is 135 nm, and the length of the space between the gates 101 and 102 is 100 nm. The contact 103 is placed 30 nm from each gate 101 and 102, which conforms with the 5 nm grid, is physically symmetrical and thus results in overall symmetrical behavior.

Some high-performance circuits such as word line drivers use a gate with a 30 nm gate length, which when applied to the design 100, makes significant changes if the gate pitch is to be preserved. Typically, the gate pitch in word line drivers is preferred to match with the word line pitch in the memory array. For example, the distance between gates 101 and 102 increases from 100 nm to 105 nm. To achieve symmetrical behavior, the midpoint between the two gates 101 and 102, which is 52.5 nm is where the contacts would be conventionally positioned. Such a location, however, does not conform to a 5 nm manufacturing grid, nor even to a 1 nm grid. Currently, there is no technique available to reposition the circuit structures in the design 100 to accommodate a 30 nm gate length without switching to a finer grid and obtaining waivers of design rules.

BRIEF SUMMARY

According to one embodiment, an integrated circuit device comprises a first semiconductor structure and a second semiconductor structure arranged proximately to each other and defining a space therebetween and conductive structures distributed in the space between the first and second semiconductor structures. At least a first one of the conductive structures is placed closer to the first semiconductor structure than to the second semiconductor structure. At least a second one of the conductive structures is placed closer to the second semiconductor structure than to the first semiconductor structure. A first group of the conductive structures has a first offset from a line of symmetry between the first and second semiconductor structures, and a second group of the conductive structures has a second offset from the line of symmetry. The first and second offsets substantially cancel out.

According to another embodiment, an integrated circuit device comprises a first semiconductor structure and a second semiconductor structure arranged proximately to each other and defining a space therebetween. Multiple means for conducting electric charge are also included, and respective ones of conducting means are arranged within the space and have respective non-zero offsets from a line of symmetry between the first and second semiconductor structures. The respective offsets have asymmetrical Resistive Capacitive (RC) effects that add substantially to zero.

In another embodiment, a method for fabricating an integrated circuit includes forming first and second semiconductor structures on a semiconductor substrate, the first and second semiconductor structures arranged proximately with respect to each other. The method also includes forming conductive structures between the first and second semiconductor structures. The conductive structures are arranged asymmetrically and with offsetting RC behavior.

The foregoing has outlined rather broadly the features and technical advantages of the present disclosure in order that the detailed description that follows may be better understood. Additional features and advantages will be described hereinafter which form the subject of the claims of the disclosure. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the technology of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 2:
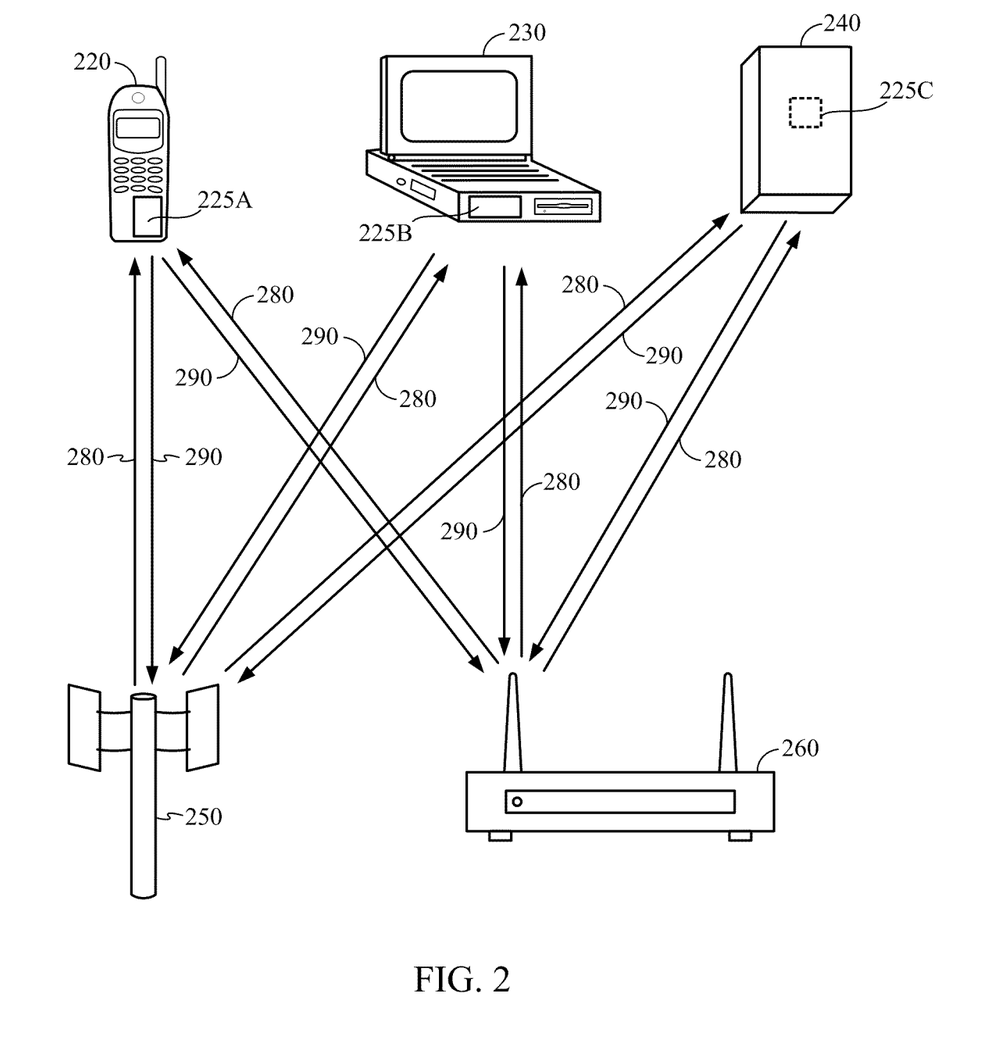
FIG. 2 shows an exemplary wireless communication system in which an embodiment of the disclosure may be advantageously employed.

FIG. 2 shows an exemplary wireless communication system 200 in which an embodiment of the disclosure may be advantageously employed. For purposes of illustration, FIG. 2 shows three remote units 220, 230, and 240 and two base stations 250 and 260. It will be recognized that wireless communication systems may have many more remote units and base stations. Remote units 220, 230, and 240 include improved semiconductor circuitry 225A, 225B, and 225C, respectively, which include embodiments of the disclosure as discussed further below. FIG. 2 shows forward link signals 280 from the base stations 250 and 260 and the remote units 220, 230, and 240 and reverse link signals 290 from the remote units 220, 230, and 240 to base stations 250 and 260.

In FIG. 2, remote unit 220 is shown as a mobile telephone, remote unit 230 is shown as a portable computer, and remote unit 240 is shown as a computer in a wireless local loop system. For example, the remote units may be mobile phones, hand-held personal communication systems (PCS) units, portable data units such as personal data assistants, GPS enabled devices, navigation devices, set top boxes, media players, such as music players, video players, and entertainment units, fixed location data units such as meter reading equipment, or any other device that stores or retrieves data or computer instructions, or any combination thereof. Although FIG. 2 illustrates remote units according to the teachings of the disclosure, the disclosure is not limited to these exemplary illustrated units. The disclosure may be suitably employed in any device which includes an integrated circuit.

Figure 3:
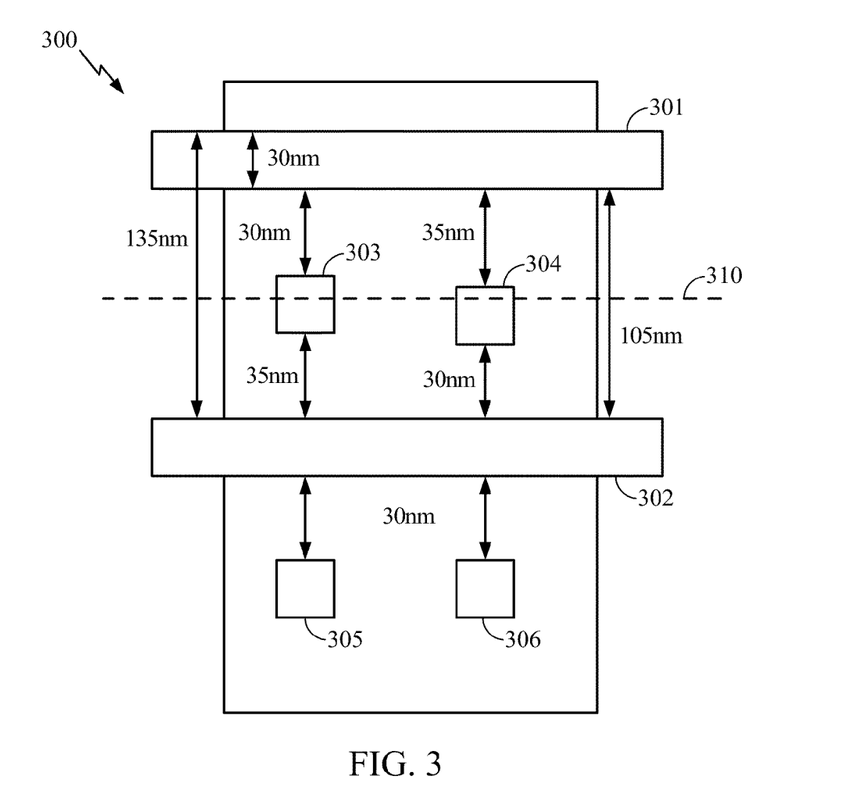
FIG. 3 is an illustration of an exemplary circuit, adapted according to one embodiment of the disclosure.

FIG. 3 is an illustration of an exemplary circuit 300, adapted according to one embodiment of the disclosure. The circuit 300 includes gates 301 and 302 and contacts 303-306. In one example, the contacts 303, 304 are used as a source and the contacts 305, 306 are used as a drain (or vice versa). The gates 301 and 302 have gate lengths of 30 nm, and the gate pitch is 135 nm. The circuit 300 includes a configuration of the contacts 303 and 304 that is not symmetric. In this case, each contact 303 and 304 is offset somewhat from the line of symmetry 310, which runs parallel to the gates 301 and 302. The circuit 300 ameliorates many of the concerns that arise when applying a 30 nm gate length to the design of FIG. 1. Specifically, the circuit 300 conforms to a 5 nm grid and has no waivers from traditional design rules.

Asymmetric configuration of structures is generally disfavored in the industry because of concerns about asymmetrical RC behavior. Specifically, using the circuit 300 as an example, there is capacitance between the gate 301 and the contacts 303 and 304, and there is resistance as the current flows from the gate 301 to the contacts 303 and 304 (or vice versa). Similarly, there is resistance and capacitance between the contacts 303 and 304 and the gate 302, as well. Both the resistance and the capacitance are affected by the distance of each contact 303 and 304 to the gates 301 and 302. The respective RC behaviors of the contacts 303 and 304 are different because the contacts 303 and 304 have different distances to the gates 301 and 302.

The circuit 300 reduces or eliminates the effects of asymmetrical RC behavior by placing the contacts 303 and 304 such that their respective asymmetrical RC behaviors cancel each other out. In this example, the offset distance of contact 304 on one side of the line 310 is balanced by the offset distance of contact 303 on the other side of the line 310. Thus, the asymmetrical RC effects attributable to the placement of contact 303 are canceled by the asymmetrical RC effects attributable to the placement of the contact 304. In this example it is understood that there may still be some amount of asymmetrical RC behavior, but such asymmetrical RC behavior is substantially eliminated so that it does not affect the functionality of the circuit 300. Devices (not shown herein for convenience) that are in electrical communication with the circuit 300 experience the same functionality as if the contacts 303 and 304 were arranged symmetrically. Accordingly, devices in communication with contacts 303, 304 and with contacts 305, 306 should see the same amount of current from contacts 303 and 304 as with 305 and 306 when those respective contacts pass current. Thus, the circuit 300 is locally asymmetric but appears symmetric as a whole to other devices.

While FIG. 3 shows gates and contacts, it is understood that the concept illustrated in FIG. 3 can be applied to other circuit structures. In fact, any conductive structures in an integrated circuit that can be arranged asymmetrically but with canceling asymmetrical RC behavior can be employed in various embodiments. Examples of such conductive structures include, but are not limited to, metal vias, contacts for use with resistors and capacitance devices, and the like. Furthermore, a variety of elongate structures other than gates can be used as well, such as metal lines, conductive plates, and the like.

Figure 4A:
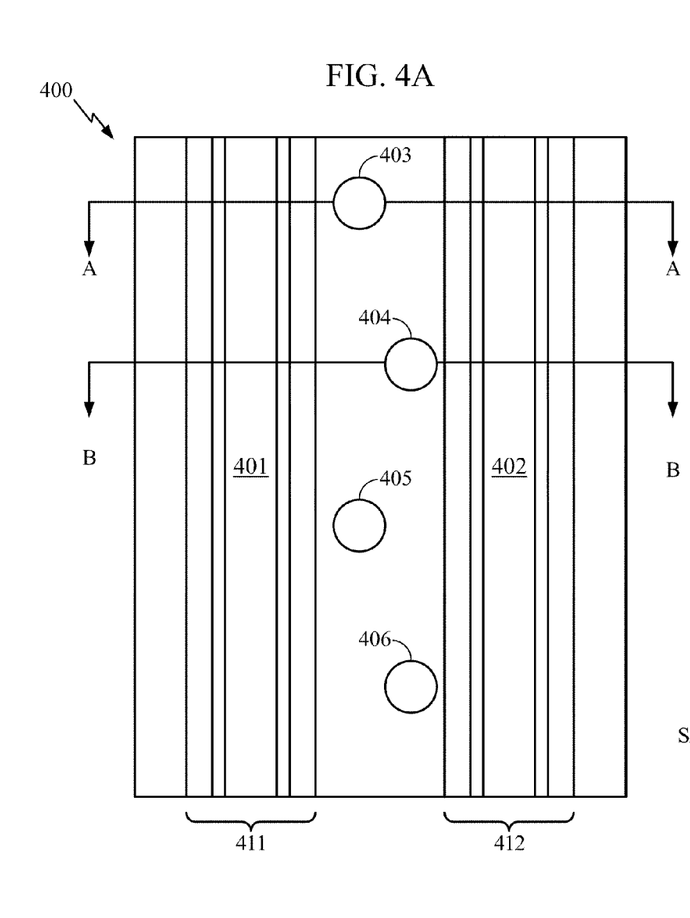
FIG. 4A is a top-down view of the circuit, adapted according to one embodiment of the disclosure.
Figure 4B:
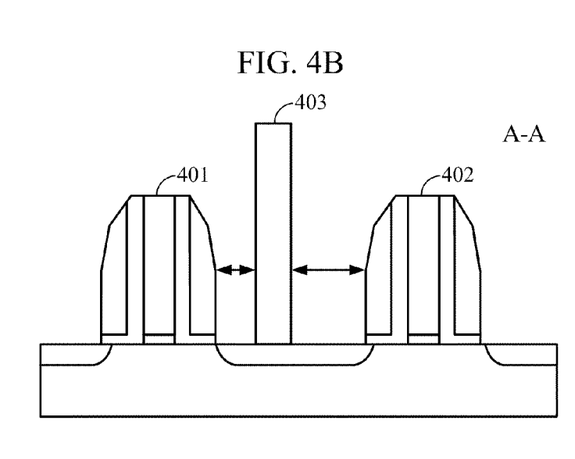
FIG. 4B and FIG. 4C are cut-away views of the circuit shown in FIG. 4A.
Figure 4C:
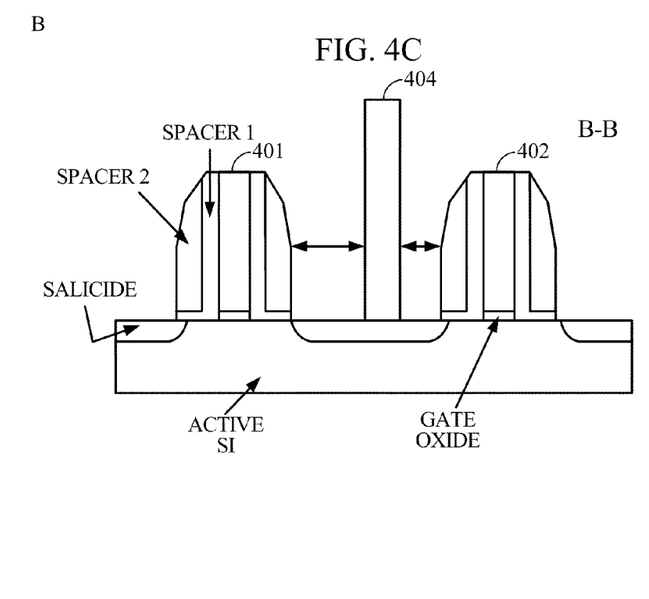

FIG. 4A is a top-down view of the circuit 400, adapted according to one embodiment of the disclosure. FIG. 4B and FIG. 4C are cut-away views of the circuit 400. The circuit 400 includes the gates 401 and 402 built in the Metal Oxide Semiconductor (MOS) channels 411 and 412. The circuit 400 also includes the electrical contacts 403-406. While FIG. 4A shows four contacts 403-406, various embodiments can be scaled to include any number of asymmetrically-placed conductive structures. Furthermore, while FIGS. 4A-C are shown using silicon and MOS technology, other embodiments may employ different materials and technologies, such as GaAs, AlGaAs, and/or the like. As in FIG. 3, the circuit 400 is locally asymmetrical but appears symmetrical to other circuits.

Figure 5:
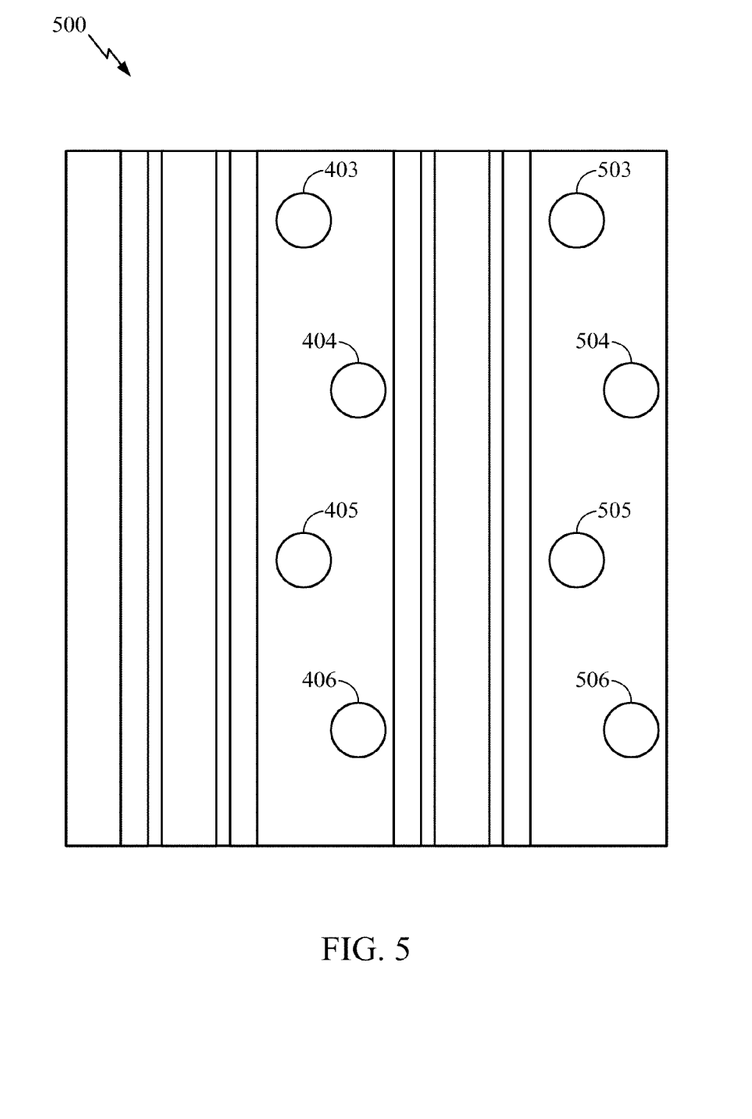
FIG. 5 is a top-down view of the circuit, adapted according to one embodiment of the disclosure.
Figure 6:
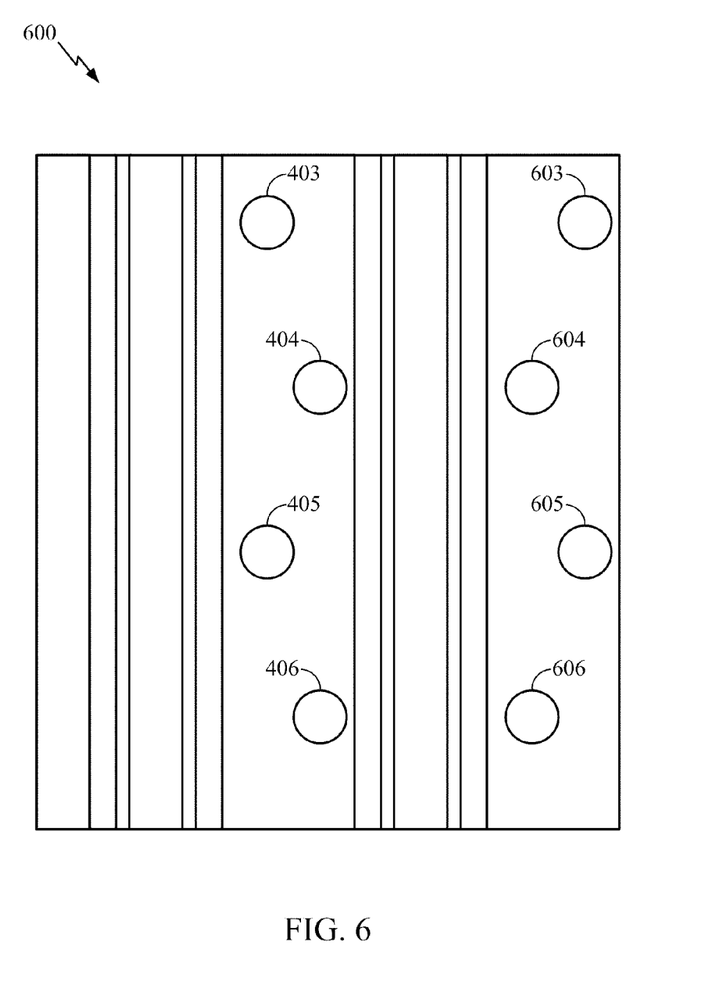
FIG. 6 is a top-down view of the circuit, adapted according to one embodiment of the disclosure.
Figure 7:
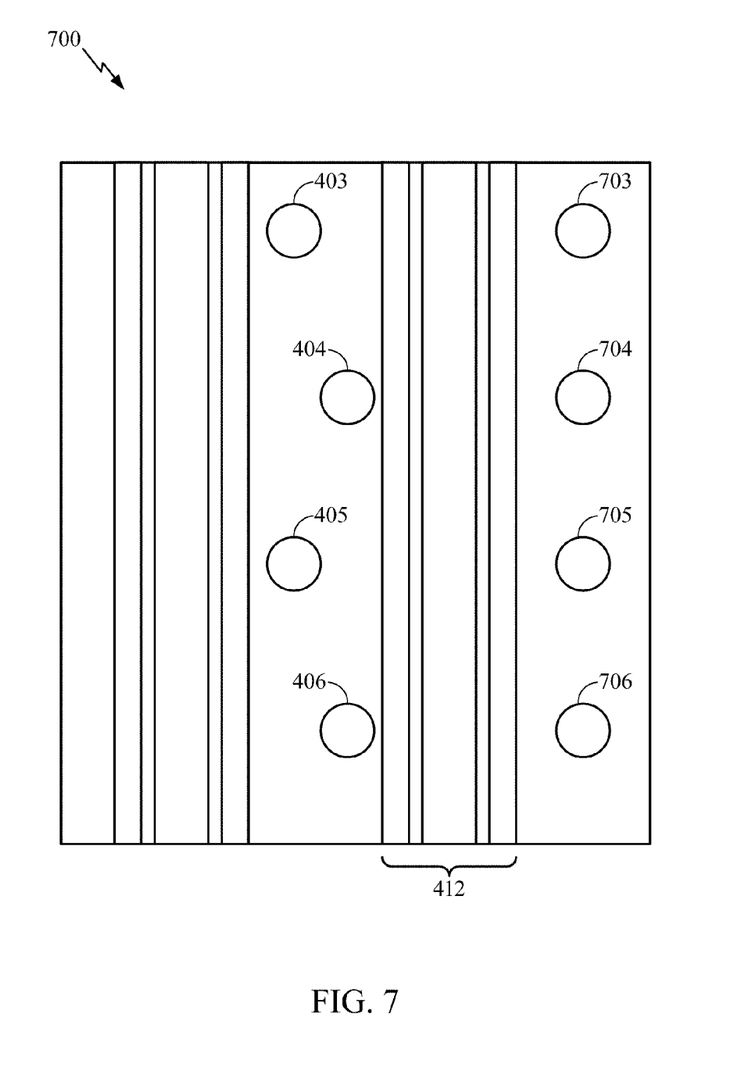
FIG. 7 is a top-down view of the circuit, adapted according to one embodiment of the disclosure.

FIG. 5 is a top-down view of the circuit 500, adapted according to one embodiment of the disclosure. The circuit 500 is similar to the circuit 400 (FIG. 4) but includes a second row of contacts 503-506. The contacts 503-506 are also asymmetrically placed and conform to a pattern of placement the same as that of the contacts 403-406. FIG. 6 is a top-down view of the circuit 600, adapted according to one embodiment of the disclosure. The circuit 600 includes a second row of contacts 603-606, which have a pattern of asymmetry that is a mirror image of that of the pattern of the contacts 403-406. FIG. 7 is a top-down view of the circuit 700, adapted according to one embodiment of the disclosure. The circuit 700 includes a second row of contacts 703-706, which are placed symmetrically with respect to a line drawn parallel to the channel 412. FIGS. 5-7 illustrate that embodiments can be scaled to include other groupings of conductive structures (e.g., row or columns of contacts) and that the various groupings can be asymmetrical according to any of a variety of patterns or even be symmetrical.

Figure 8:
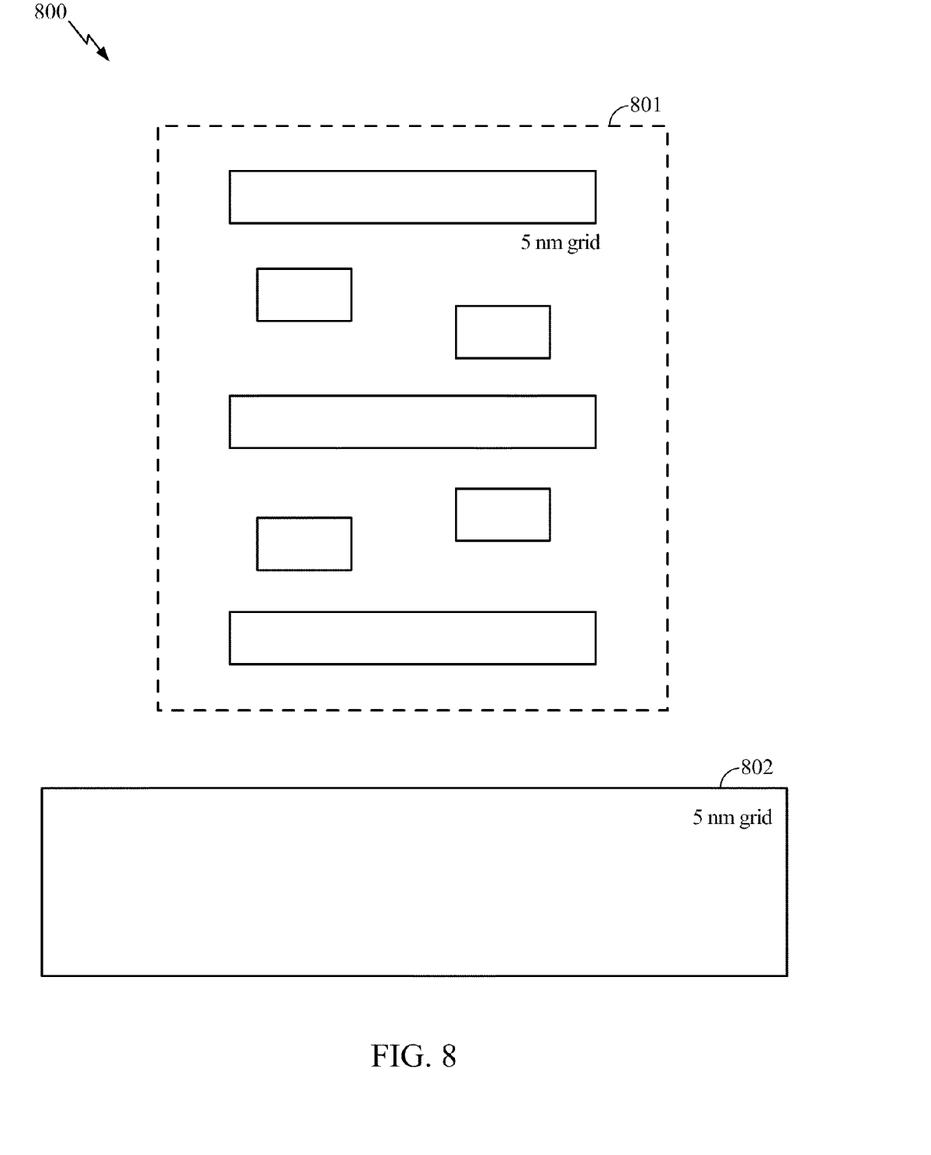
FIG. 8 is an illustration of exemplary memory circuit adapted according to one embodiment of the disclosure.

The concepts illustrated above and in FIGS. 3-7 may be incorporated into any of a variety of design components, such as vias and conductive metal lines, fuses, resistors, capacitors, and the like. In one example, a circuit, such as that shown in FIG. 3, is placed in a word line driver that is part of a memory circuit. FIG. 8 is an illustration of exemplary memory circuit 800 adapted according to one embodiment of the disclosure. The memory circuit 800 includes a locally asymmetric word line driver 801 and a memory array 802. In this example, the memory array 802 has a 5 nm gate pitch. Generally, in scenarios wherein a word line driver and an adjacent memory array have different sized grids, unexpected spacing issues can result at the boundary where the two circuits are placed together. By contrast, the word line driver 801 can use, e.g., a 30 nm gate length, while at the same time using a 5 nm grid as explained above with respect to FIG. 3. In this way, a designer can match the 5 nm grid of the word line driver 801 to the 5 nm grid of the memory array 802.

Thus, various embodiments shown herein include advantages over prior art approaches. One such advantage is that asymmetrical placement of structures may, in some cases, allow a designer to use a desired grid and to avoid having to resort to using a smaller grid. Often, going to a smaller grid adds increased costs to a design due to increased data volume, and unexpected spacing errors at boundaries. In addition, the various embodiments reduce or eliminate the need for waivers from traditional design rules.

Figure 9:
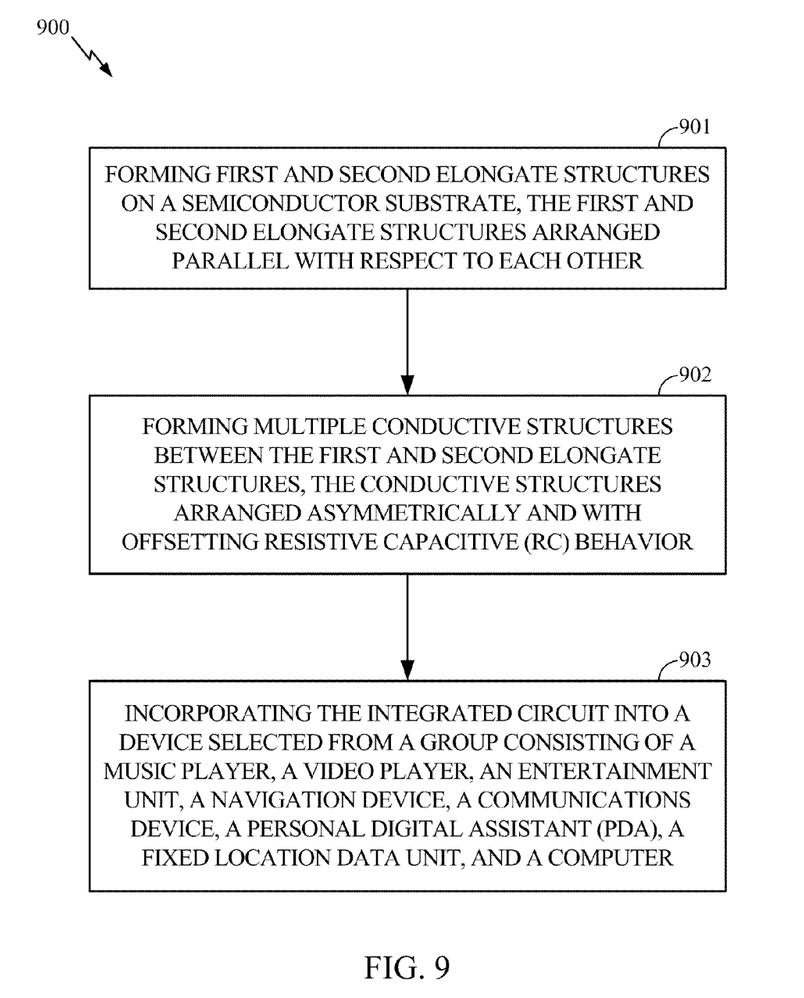
FIG. 9 is an illustration of an exemplary method for fabricating a circuit, such as any one of the circuits shown in FIGS. 3-8.

Some embodiments include methods for fabricating integrated circuits with asymmetrical arrangements of structures. FIG. 9 is an illustration of an exemplary method 900 for fabricating a circuit, such as any one of the circuits shown in FIGS. 3-8.

In block 901, first and second elongate structures are formed on a semiconductor substrate, the first and second elongate structures arranged parallel with respect to each other. Some examples of elongate structures include the channels and gates of FIG. 4.

In block 902, multiple conductive structures are formed between the first and second elongate structures The conductive structures are arranged asymmetrically and with offsetting RC behavior. Examples of conductive structures include the contacts of FIG. 4. The conductive structures of block 902 and the elongate structures of block 901 can be formed on a semiconductor substrate using any of a variety of techniques now known or later developed, including, but not limited to, etching and deposition techniques.

In block 903, the integrated circuit is incorporated into a device selected from a group consisting of a music player, a video player, an entertainment unit, a navigation device, a communications device, a personal digital assistant (PDA), a fixed location data unit, and a computer. For example, in embodiments wherein the integrated circuit is used in a memory circuit, the memory can be a Random Access Memory (RAM) in a computing device to hold instructions and/or data.

While the method 900 is shown as a series of discrete blocks, various embodiments are not so limited. For instance, the processes of blocks 901 and 902 can, in some embodiments, be performed at the same time or each as a series of subprocesses (e.g., deposition), some of the subprocesses being common to both of blocks 901 and 902.

Figure 10:
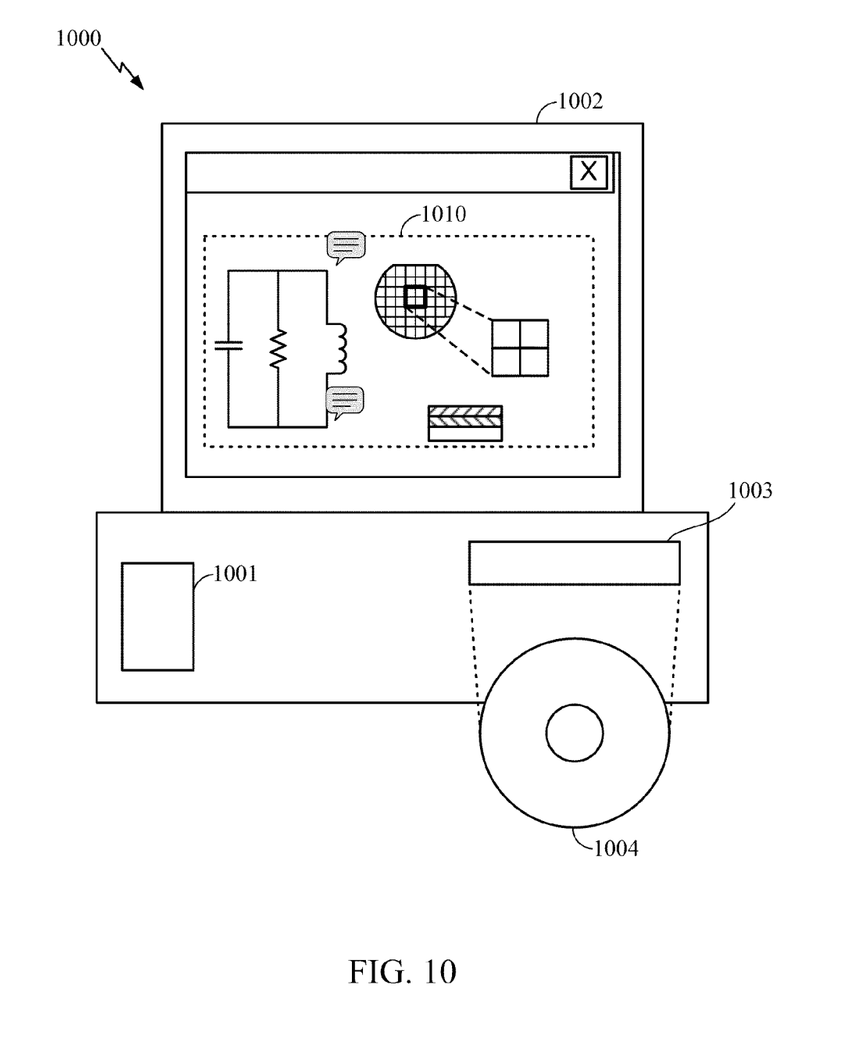
FIG. 10 is a block diagram illustrating a design workstation used for circuit, layout, and logic design of a semiconductor component according to one embodiment of the disclosure.

FIG. 10 is a block diagram illustrating a design workstation for circuit layout and wafer and die design of a semiconductor part as disclosed above. A design workstation 1000 includes a hard disk 1001 containing operating system software, support files, and design software such as Cadence or OrCAD. The design workstation 1000 also includes a display to facilitate design of a semiconductor part 1010 that may include a semiconductor wafer, and/or a semiconductor die. A storage medium 1004 is provided for tangibly storing the design of the semiconductor part 1010. The design of the semiconductor part 1010 may be stored on the storage medium 1004 in a file format such as GDSII or GERBER. The storage medium 1004 may be a CD-ROM, DVD, hard disk, flash memory, or other appropriate device. Furthermore, the design workstation 1000 includes a drive apparatus 1003 for accepting input from or writing output to the storage medium 1004.

Data recorded on the storage medium 1004 may specify configurations, pattern data for photolithography masks, or mask pattern data for serial write tools such as electron beam lithography. Providing data on the storage medium 1004 facilitates the design of the semiconductor part 1010 by decreasing the number of processes for manufacturing and/or designing semiconductor wafers and/or semiconductor dies.

Although specific circuitry has been set forth, it will be appreciated by those skilled in the art that not all of the disclosed circuitry is required to practice the disclosure. Moreover, certain well known circuits have not been described, to maintain focus on the disclosure.

Although the present disclosure and its advantages have been described in detail, it should be understood that various changes, substitutions and alterations can be made herein without departing from the technology of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An integrated circuit device comprising:
a first semiconductor structure, a second semiconductor structure and a third semiconductor structure, each disposed on a surface of a semiconductor substrate, the second semiconductor structure between the first and the third semiconductor structures, and arranged proximately to each of the first and third semiconductor structures, a first space defined between the first and the second semiconductor structures, and a second space defined between the second and the third semiconductor structures;
a first and second plurality of conductive structures, each disposed on the surface of the semiconductor substrate, the first and second plurality of conductive structures distributed in the first and second spaces, respectively, at least a first one of the first plurality of conductive structures placed closer to the first semiconductor structure than to the second semiconductor structure, and at least a second one of the first plurality of conductive structures placed closer to the second semiconductor structure than to the first semiconductor structure, wherein a first group of the first plurality of conductive structures has a first offset from a line of symmetry between the first and second semiconductor structures, and a second group of the first plurality of conductive structures has a second offset from the line of symmetry, the first and second offsets substantially canceling out, the second plurality of conductive structures having an asymmetric pattern that mirrors a pattern of the first plurality of conductive structures.

2. The integrated circuit device of claim 1 wherein the first and second semiconductor structures are built in Metal Oxide Semiconductor (MOS) channels.

3. The integrated circuit device of claim 1 wherein the first and second semiconductor structures comprise semiconductive gates.

4. The integrated circuit device of claim 1 wherein the plurality of conductive structures comprise contacts.

5. The integrated circuit device of claim 1, in which the integrated circuit device is included in a semiconductor die.

6. The integrated circuit device of claim 1 comprising a word line driver.

7. The integrated circuit device of claim 6 further comprising a memory array in communication with the word line driver.

8. The integrated circuit device of claim 1 incorporated into a music player, a video player, an entertainment unit, a navigation device, a communications device, a personal digital assistant (PDA), a fixed location data unit, and/or a computer.

9. The integrated circuit device of claim 1, in which the first semiconductor structure comprises a first elongate semiconductor structure and the second semiconductor structure comprises a second elongate semiconductor structure.

10. An integrated circuit device comprising:
a first semiconductor structure, a second semiconductor structure and a third semiconductor structure, each disposed on a surface of a semiconductor substrate, the second semiconductor structure between the first and the third semiconductor structures, and arranged proximately to each of the first and third semiconductor structures, a first space defined between the first and the second semiconductor structures, and a second space defined between the second and the third semiconductor structures; and
first and second means for conducting electric charge, each of the first and second conducting means being disposed on the surface of the semiconductor substrate, the first and second conducting means arranged within the first and second spaces, respectively, the first conducting means having respective non-zero offsets from a line of symmetry between the first and second semiconductor structures, the respective non-zero offsets having asymmetrical Resistive Capacitive (RC) effects that add substantially to zero, the second conducting means having an asymmetric pattern that mirrors a pattern of the first conducting means.

11. The integrated circuit device of claim 10 wherein the respective ones of the first and second conducting means are arranged asymmetrically about their respective lines of symmetry.

12. The integrated circuit device of claim 10 wherein the respective ones of the first and second conducting means are staggered about their respective lines of symmetry.

13. The integrated circuit device of claim 10, in which the integrated circuit device is included in a semiconductor die.

14. The integrated circuit device of claim 10 comprising a word line driver.

15. The integrated circuit device of claim 14 further comprising a memory array in communication with the word line driver.

16. The integrated circuit device of claim 10, in which the first semiconductor structure comprises a first elongate semiconductor structure and the second semiconductor structure comprises a second elongate semiconductor structure.

17. The integrated circuit device of claim 10 incorporated into a music player, a video player, an entertainment unit, a navigation device, a communications device, a personal digital assistant (PDA), a fixed location data unit, and/or a computer.

18. A method for fabricating an integrated circuit, the method comprising:
forming first, second and third semiconductor structures on a semiconductor substrate, the second semiconductor structure between the first and the third semiconductor structures, and arranged proximately to each of the first and third semiconductor structures, a first space defined between the first and the second semiconductor structures, and a second space defined between the second and the third semiconductor structures; and
forming a first and second plurality of conductive structures within the first and second spaces, respectively, the first plurality of conductive structures arranged asymmetrically and with offsetting Resistive Capacitive (RC) behavior, the second plurality of conductive structures having an asymmetric arrangement that mirrors the arrangement of the first plurality of conductive structures.

19. The method of claim 18 further comprising:
incorporating the integrated circuit into a music player, a video player, an entertainment unit, a navigation device, a communications device, a personal digital assistant (PDA), a fixed location data unit, and/or a computer.

20. The method of claim 18 in which the integrated circuit comprises: a word line driver.

21. The method of claim 20 in which the integrated circuit further comprises: a memory array in communication with the word line driver.

22. A method for fabricating an integrated circuit, the method comprising the steps of:
forming first, second and third semiconductor structures on a semiconductor substrate, the second semiconductor structure between the first and the third semiconductor structures, and arranged proximately to each of the first and third semiconductor structures, a first space defined between the first and the second semiconductor structures, and a second space defined between the second and the third semiconductor structures; and
forming a first and second plurality of conductive structures within the first and second spaces, respectively, the first plurality of conductive structures arranged asymmetrically and with offsetting Resistive Capacitive (RC) behavior, the second plurality of conductive structures having an asymmetric arrangement that mirrors the arrangement of the first plurality of conductive structures.

23. The method of claim 22 further comprising the step of:
incorporating the integrated circuit into a music player, a video player, an entertainment unit, a navigation device, a communications device, a personal digital assistant (PDA), a fixed location data unit, and/or a computer.

* * * * *